United States Patent
Colavito et al.

(10) Patent No.: US 6,525,340 B2
(45) Date of Patent: Feb. 25, 2003

(54) SEMICONDUCTOR DEVICE WITH JUNCTION ISOLATION

(75) Inventors: David Colavito, Rock Hill, NY (US); Nivo Rovedo, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/873,497

(22) Filed: Jun. 4, 2001

(65) Prior Publication Data

US 2002/0179905 A1 Dec. 5, 2002

(51) Int. Cl.⁷ .......................................... H01L 31/0312
(52) U.S. Cl. ......................... 257/57; 257/77; 257/347; 257/350
(58) Field of Search ........................... 257/57, 77, 347, 257/350, 611, 617; 438/302, 305

(56) References Cited

U.S. PATENT DOCUMENTS

| | | |
|---|---|---|
| 3,861,968 A | 1/1975 | Magdo et al. |
| 3,883,372 A | 5/1975 | Lin |
| 3,975,752 A | 8/1976 | Nicolay |
| 4,545,110 A * | 10/1985 | Maas et al. ................... 438/303 |
| 4,999,313 A | 3/1991 | Arikawa et al. |
| 5,275,963 A | 1/1994 | Cederbaum et al. |
| 5,326,991 A * | 7/1994 | Takasu ........................ 257/350 |
| 5,330,925 A | 7/1994 | Lee et al. |
| 5,563,096 A | 10/1996 | Nasr |
| 5,578,854 A | 11/1996 | Chen et al. |
| 5,578,865 A * | 11/1996 | Vu et al. ..................... 257/349 |
| 5,627,393 A | 5/1997 | Hsu |
| 5,641,698 A * | 6/1997 | Lin ............................ 438/302 |
| 5,972,758 A | 10/1999 | Liang |
| 6,064,092 A | 5/2000 | Park |
| 6,104,060 A | 8/2000 | Hshieh et al. |
| 6,114,726 A | 9/2000 | Barkhordarian |
| 6,130,457 A * | 10/2000 | Yu et al. ..................... 257/347 |

* cited by examiner

*Primary Examiner*—David Nelms
*Assistant Examiner*—Dao H. Nguyen
(74) *Attorney, Agent, or Firm*—Margaret A. Pepper

(57) ABSTRACT

A field effect transistor (FET) is disclosed. In an exemplary embodiment of the invention, the FET includes an active semiconductor region defined upon a substrate, the active semiconductor region further having a mesa region formed therein. The FET also includes a gate formed within the active semiconductor region, the gate abutting the mesa region along one side thereof. The FET further includes a source region defined within a first area of the semiconductor region, the first region being located over an insulating layer, and a drain region defined within a second area of the semiconductor region, the second area also being located over the insulating layer. The first and second areas of the semiconductor region are located on opposite sides of the mesa region, and the insulating layer isolates the source region and the drain region from the substrate. In another exemplary embodiment, one of the source region or drain region is defined within a top surface of the mesa region.

13 Claims, 6 Drawing Sheets

SEMICONDUCTOR DEVICE WITH JUNCTION ISOLATION

BACKGROUND

The present invention relates generally to semiconductor processing and, more particularly, to semiconductor device formation having junction isolation.

In the manufacture of semiconductor devices such as MOSFETS, advances in process technology and digital system architecture have led to integrated circuits having increased operating frequencies. Unfortunately, higher operating frequencies result in undesirable increases in power consumption. Power consumption is a significant problem in integrated circuit design generally, and particularly in large scale, high speed products such as processors and microprocessors. Nonetheless, the trend of integrating more functions on a single substrate while operating at ever higher frequencies goes on unabated. One way to improve integrated circuit performance is by reducing the loading capacitance of metal-oxide-semiconductor field effect transistors (MOSFETs). Transistor loading capacitance generally has three components: intrinsic gate capacitance, overlap capacitance, and junction capacitance.

Junction capacitance occurs as a result of the capacitive coupling between the source and drain terminals of an FET with the underlying substrate, by virtue of the junction therebetween. One way to reduce junction capacitance is to form MOSFETs upon an insulating substrate. This is often referred to as silicon-on-insulator (SOI) technology. In a typical SOI process, junction capacitance is reduced through isolating junctions from the substrate by interposing a thick buried oxide layer. However, short-channel MOSFETs (constructed with thick buried oxide layers which isolate their junctions from the substrate) tend to have poor punch-through characteristics, poor short-channel characteristics and other effects related to the floating body. In addition, SOI technology is more expensive to implement and generally does not permit contact to the underlying substrate for device control.

SUMMARY

The above discussed and other drawbacks and deficiencies of the prior art are overcome or alleviated by a method for forming a field effect transistor (FET). In an exemplary embodiment of the invention, the method includes defining an active semiconductor region upon a substrate, the active semiconductor region further having a mesa region formed therein. A gate is formed within the active semiconductor region, the gate abutting the mesa region along one side thereof. Then, a source region is defined within a first area of the semiconductor region, the first region being located over an insulating layer. A drain region is defined within a second area of the semiconductor region, the second area also being located over the insulating layer. The first and second areas of the semiconductor region are located on opposite sides of the mesa region, and the insulating layer isolates the source region and the drain region from the substrate.

In a preferred embodiment, the active semiconductor region is formed by forming the insulating layer upon the substrate. Then, a window opening is formed within the insulating layer and an epitaxial layer is grown over the insulating layer and the window opening, wherein the mesa region is formed over the window opening. Preferably, the insulating layer further comprises a dielectric pad layer formed upon the substrate, and the substrate further comprises single crystalline material beneath the window opening.

BRIEF DESCRIPTION OF THE DRAWINGS

Referring to the exemplary drawings wherein like elements are numbered alike in the several Figures.

DETAILED DESCRIPTION

Figure 1:
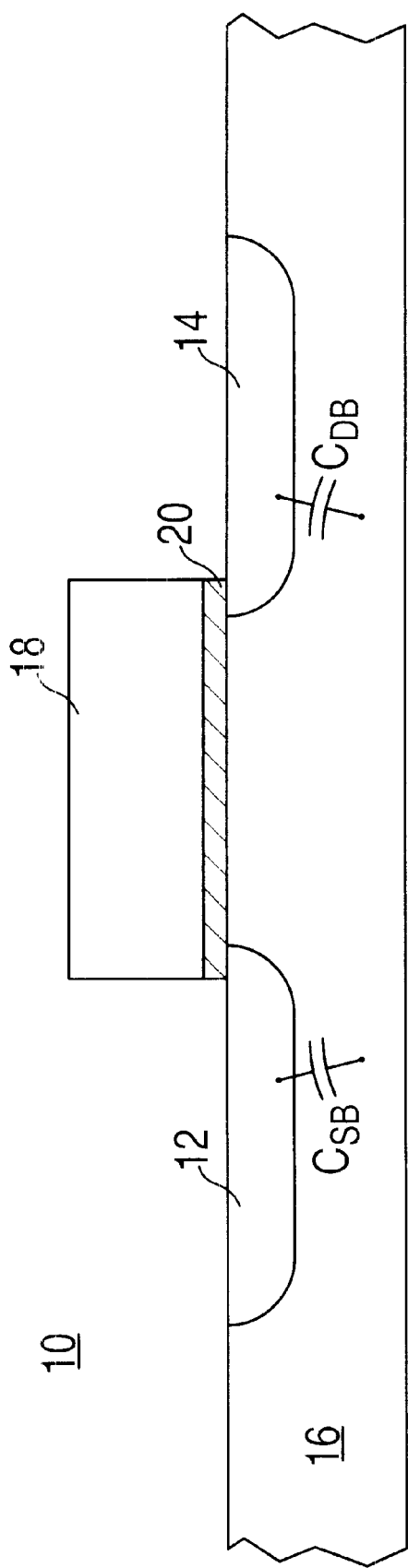
FIG. 1 illustrates an existing field effect transistor (FET) structure without isolation between the source/drain junctions and the underlying substrate.

Referring initially to FIG. 1, there is shown an existing field effect transistor (FET) structure. FET structure 10 includes source and drain regions 12, 14, formed within a substrate 16, such as silicon. Source and drain regions 12, 14 are created by implanting a dopant material (e.g., boron) into patterned regions within selected areas of substrate 16. A gate 18 is formed upon a gate oxide 20 which, in turn, is formed upon substrate 16. As mentioned previously, one element of parasitic capacitance in an FET device results from junction capacitance. This junction capacitance is associated with the space charge region which results from the difference in the doping levels between the source/drain regions 12, 14 and the body material of substrate 16. Schematically, these junction capacitances are represented as $C_{SB}$ and $C_{DB}$.

Again, one known solution to the junction capacitance problem is to form a silicon-on-oxide (SOI) structure, wherein a buried oxide layer is created within the substrate 16 (e.g., ionically implanting oxygen atoms into the substrate at a desired depth). However, in an SOI structure, the body of the FET is also isolated from the substrate, thereby potentially adversely affecting device control. If the body of the FET floats (i.e., is not connected to a potential source), the current/voltage characteristics and threshold voltage may vary with the switching history experienced by the FET during actual operation.

Therefore, in accordance with an embodiment of the invention, there is disclosed a method for forming a planarized field effect transistor FET, which features junction isolation properties and yet allows for coupling the body to a common voltage node (e.g., ground). The foregoing features may also be realized without the use of shallow trench isolation (STI) processing.

Figure 2A:
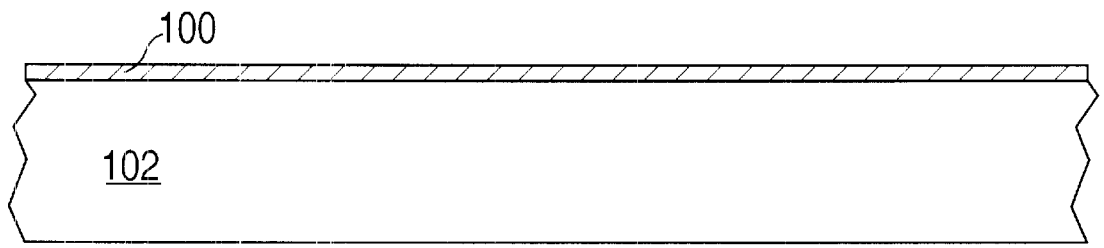
FIGS. 2(a)–(e) illustrate process steps for defining an active semiconductor region for use in accordance with an embodiment of the invention.
Figure 2B:
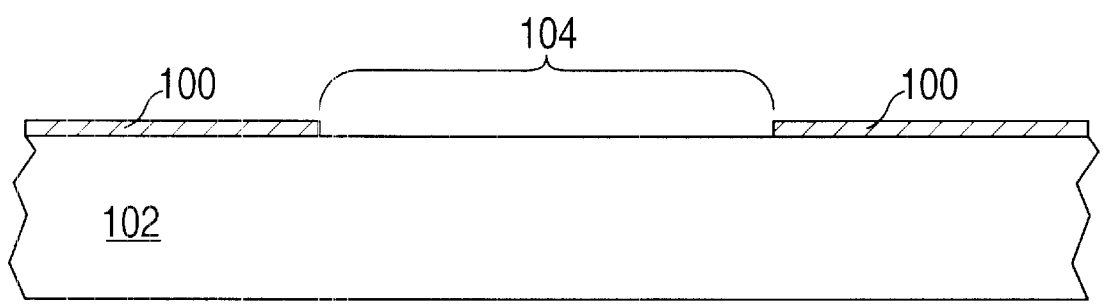

Referring specifically now to FIG. 2(a), a dielectric pad layer 100 or insulating layer is first formed upon a single crystalline substrate 102. In the example shown, the starting substrate 102 is silicon oriented in the <100> crystal plane. However, other substrate materials, such as a silicon germanium (SiGe) alloy or a silicon carbide alloy, may be used. Then, a window opening 104 is patterned and opened within the pad layer 100, as shown in FIG. 2(b). Window opening 104 may be patterned by existing photolithography techniques and opened by techniques such as wet or dry etching.

Figure 2C:
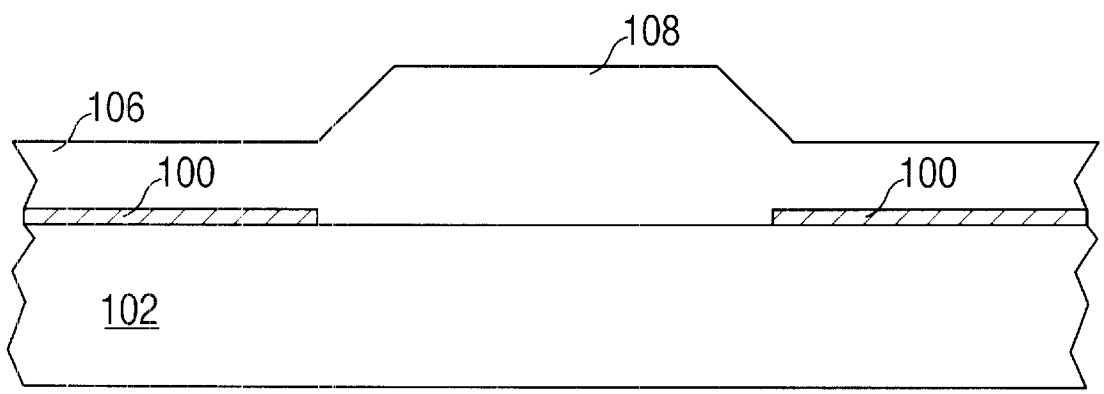

Once the window opening 104 is formed, an epitaxial layer 106 (e.g., silicon) is epitaxially grown over the pad layer 100 and opening 104, as shown in FIG. 2(c).

In those areas over substrate 102 where the pad layer 100 is present, the epitaxial growth process results in either polycrystalline silicon growth or amorphous silicon growth, depending upon the particular process conditions. However, in the area over substrate 102 where the window opening 104 is formed, the epitaxial growth process results in single crystalline growth. This, in turn, produces a mesa region 108 over window opening 104. The mesa region 108, being comprised of single crystalline silicon, is thicker than the remaining portions of epitaxial layer 106 in polycrystalline (or amorphous) form. Depending upon the particular process conditions, the growth rate of single crystalline silicon is about 1.8 times the growth of polycrystalline silicon. Thus, a representative height of mesa region 108 may be about 3,600 Å, while the corresponding thickness of the polycrystalline growth may be about 2,000 Å. However, it will be appreciated that these dimensions are exemplary only and are not to be construed in any limiting sense. Moreover, specific conditions of the epitaxial process can also be used to control the doping profile of epitaxial layer 106 in order to control the electrical properties of the resultant device.

While in a preferred embodiment, the substrate 102 is a single crystalline material, it will be appreciated that mesa region 108 could also be formed directly over a single crystal grain oriented in the <100> plane, in an otherwise polycrystalline substrate. In this instance, window opening 104 would be smaller than (and positioned directly over) a single crystal grain.

Other materials may also be used for the epitaxial layer 106 (e.g., SiGe alloys or silicon carbide alloys). However, if an alloy such as SiGe (for example) is used, then that alloy should be sufficiently lattice-matched such that a single crystalline structure having stable electrical properties is grown over window opening 104. Furthermore, it will also be noted that substrate 102 and epitaxial layer 106 need not be comprised of the same material. As one example, the substrate 102 may be a SiGe alloy and epitaxial layer 106 may be pure silicon.

Figure 2D:
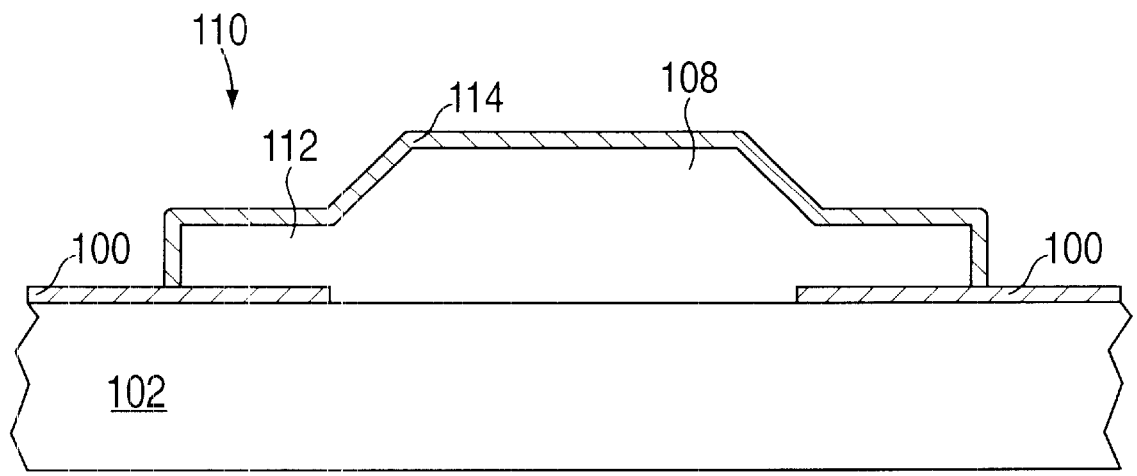
Figure 2E:
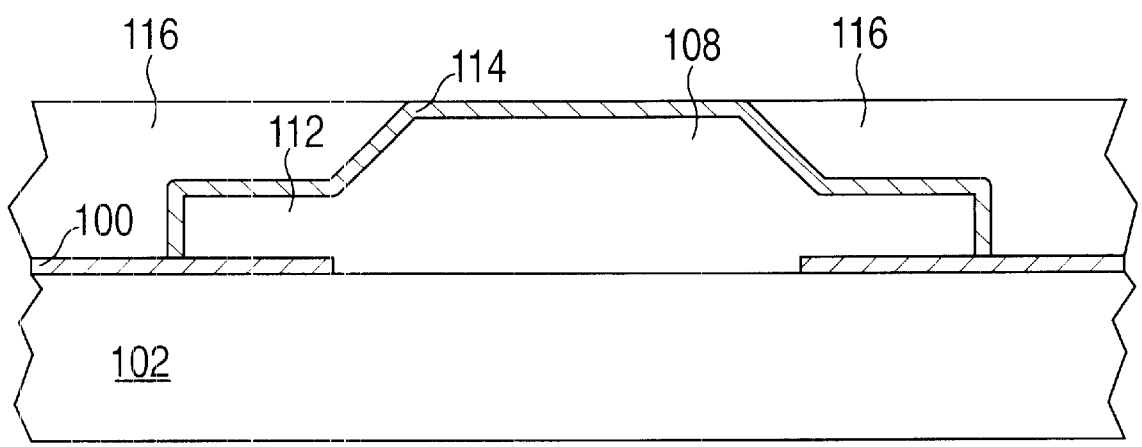

In FIG. 2(d), an active semiconductor region 110 is defined by patterning and etching, by photolithography techniques, a block 112 of the epitaxial layer 106, including the mesa region 108. Thus defined, block 112 is isolated from other active device areas formed on substrate 102. Then, a gate dielectric material, such as silicon dioxide (gate oxide), is used to form gate dielectric layer 114 atop block 112. The gate dielectric layer 114 is relatively thin, and may range from about 20 angstroms (Å) to about 100 Å, and may be formed with conventional thermal processing techniques. However, other thicknesses and materials (e.g., silicon oxynitride) may also be used for the gate dielectric layer 114. In FIG. 2(e), a gate material 116, preferably doped polysilicon, is deposited over the block 112. However, other suitable conductive materials may also be used for the gate material. The gate material 116 is then planarized (e.g., by chemical mechanical polishing) all the way down to the gate oxide 114 atop mesa region 108.

Figure 3A:
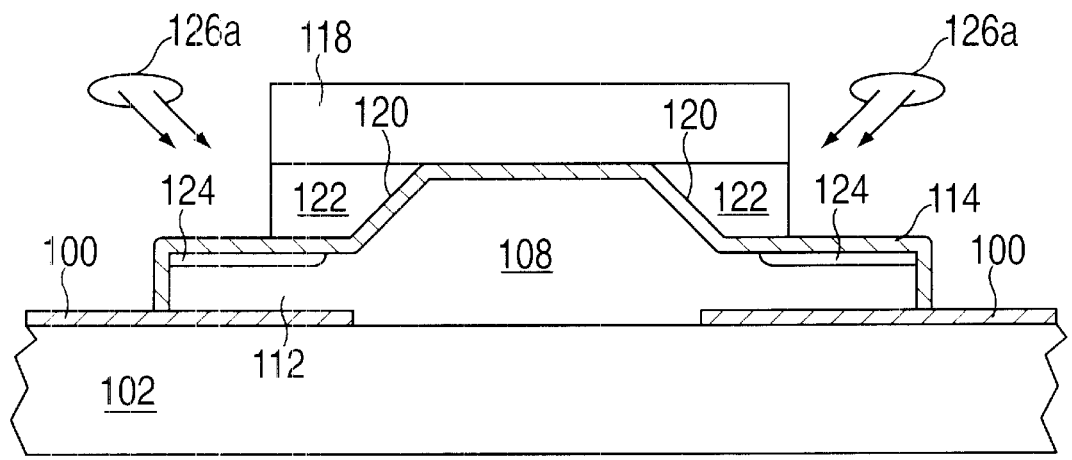
FIGS. 3(a)–(c) illustrate the formation of an FET having junction isolation properties, in accordance with one embodiment of the invention.
Figure 3B:
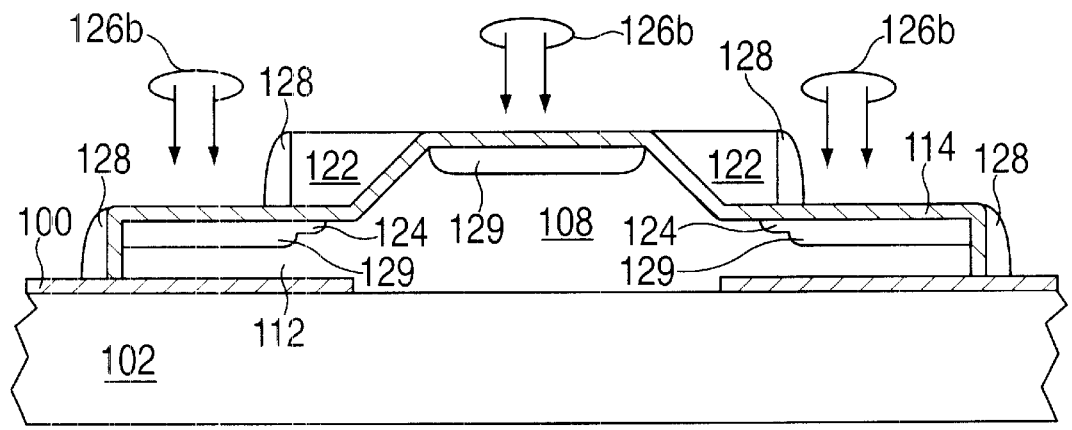
Figure 3C:
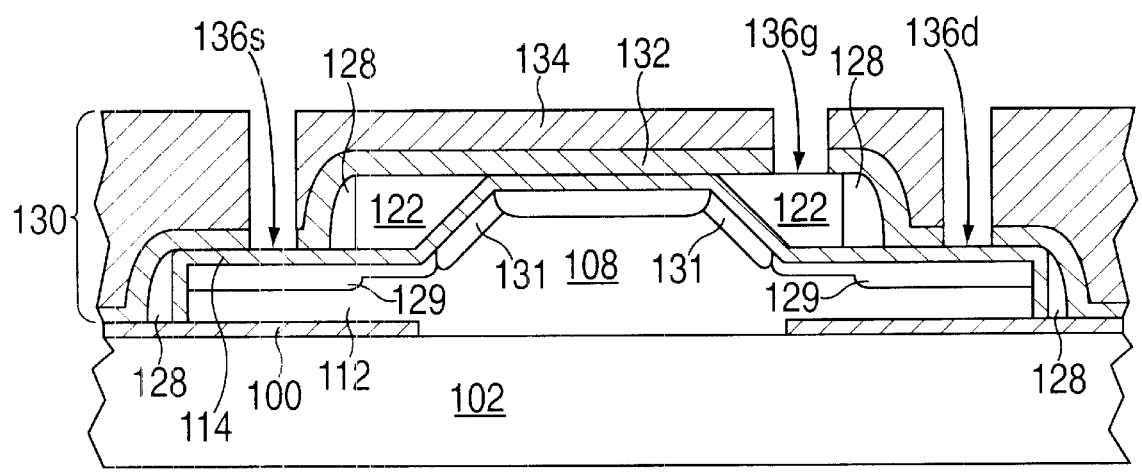

Referring now to FIGS. 3(a)–(c), the definition of the gate, source and drain regions is illustrated for one embodiment of the present invention. In FIG. 3(a), a layer of photoresist material is applied and patterned by photolithographic techniques to leave photoresist block 118, which covers mesa region 108, as well as the ramped or inclined portions 120 thereof. Then, the unmasked gate material 116 is removed by etching to form a gate 122 which surrounds mesa region 108 and abuts the inclined portions 120. A low dose implant 126a is used to form source and drain extensions, or lightly doped drain (LDD) regions 124 along opposite sides of mesa region 108. It will be noted that the extension implant may be carried out at a non-perpendicular angle, if desired, as indicated by lines 126a.

In FIG. 3(b), photoresist block 118 is removed and sidewall spacers 128 are formed in a conventional manner. Then, a higher dose implant (indicated by lines 126b) forms the source/drain diffusion areas 129. It will be noted that the top surface of mesa region 108, being implanted, also has a diffusion area 129 formed therein. However, in this embodiment, diffusion area 129 on top of mesa region 108 is not used for a source or drain terminal, but instead serves to reduce the internal resistance of semiconductor region 110.

FIG. 3(c) illustrates the completion of an FET having dual junction isolation characteristics. A thermal anneal process distributes the dopant species in the source and drain regions 129, thereby establishing electrical connections and linking source and drain regions 129 to active device channel regions 131. The annealing process may be carried out as a batch wafer process (e.g., in a furnace) or as a single wafer process (e.g., a rapid thermal process). In addition, the anneal serves to repair crystallographic damage caused during the ion implantation process.

Prior to establishing electrical contacts for the source, drain and gate areas, a dielectric stack 130 is deposited over the entire wafer. In the embodiment shown, the dielectric stack 130 includes a nitride layer 132 followed by a thicker layer 134 of borosilicate phosphorous glass (BSPG). Then, the contact openings for each area are defined by photolithography, followed by etching of the dielectric stack 130, and thereby forming contact openings or vias for the source, gate and drain terminals (136s, 136g and 136d), respectively. Further, it will also be appreciated that the location of the contact opening for the gate terminal 136g may be at either the source or drain side of mesa region 108.

The advantages of the aforementioned embodiment will be realized by consideration of the location and configuration of the source and drain terminals 136s, 136d. Because the source and drain terminal 136s, 136d are both formed in an area of block 112 grown directly over a portion of dielectric pad layer 100, both the source and drain are isolated from the substrate 102, thereby reducing the capacitive coupling of source and drain junctions to the underlying substrate.

Referring now to FIGS. 4(a)–(d), an alternative embodiment of the present invention is shown. In this particular embodiment, the source region will be formed atop the mesa region 108. While in this embodiment only the drain region will have junction isolation properties per se, an asymmetrical doping profile between source and drain regions will provide a trade-off benefit of improved punch-through characteristics and hence improved device reliability.

Figure 4A:
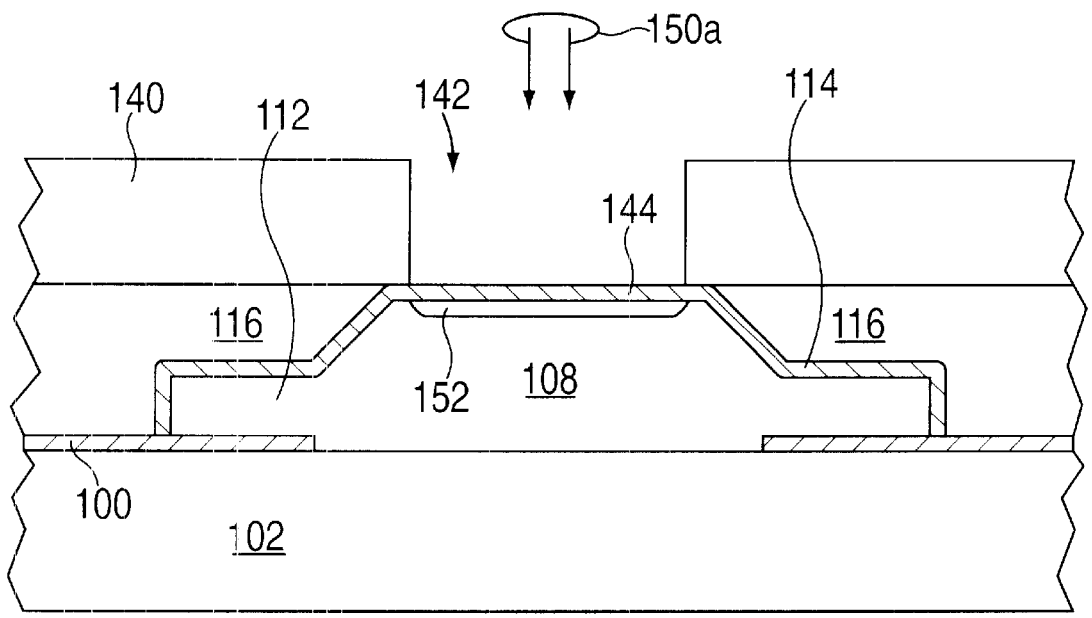
FIGS. 4(a)–(d) illustrate the formation of an FET having both junction isolation properties and improved punch-through characteristics, in accordance with an alternative embodiment of the invention.

Starting with a common stocking point (specifically the deposition of gate material 116 and subsequent planarization in FIG. 2(e)), a layer of photoresist 140 is patterned to form an opening 142 which exposes the top surface 144 of mesa region 108, as seen in FIG. 4(a). The top surface 144 comprises the location of the source region to be formed therein. Although in a preferred embodiment, it is the source region which is formed atop mesa region 108, it is to be understood that the drain and source regions may be interchangeable. That is to say, the drain region could be formed at the top of mesa region 108 while the source region could be formed elsewhere. However, since the source terminal of an FET is traditionally configured to ground potential, isolation of the source junction is less important for overall performance and efficiency than is isolation of the drain junction. Hence, in this embodiment, it is preferred to have the source terminal configured upon mesa region 108.

A first dopant implantation, indicated by arrows 150a, introduces a dopant species into the source region 152 only. First dopant implantation 150a may alternatively be done without photoresist layer 140, since the remaining portions of block 112 are still covered by gate material 116. In either case, the source region 152 will ultimately have a different (e.g., higher) dopant concentration than will the subsequently formed drain region.

Figure 4B:
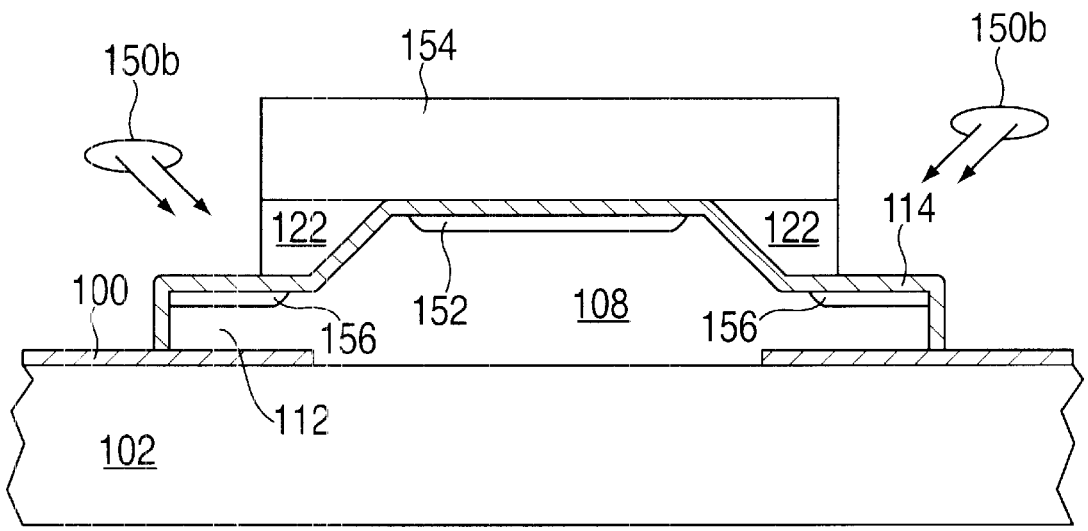

In FIG. 4(b), the photoresist layer 140 is removed (if used for first implantation 150a), and another photoresist layer is then patterned to form photoresist block 154. Photoresist block 154 covers the top surface 144 of mesa region 108, and extends outwardly so that the gate 122 may be formed by removing the exposed portions of gate material 116, similar to FIG. 3(a). Once gate 122 is formed, low dose extension implant 150b (indicated by arrows) is used to form lightly doped drain (LDD) region 156.

Figure 4C:
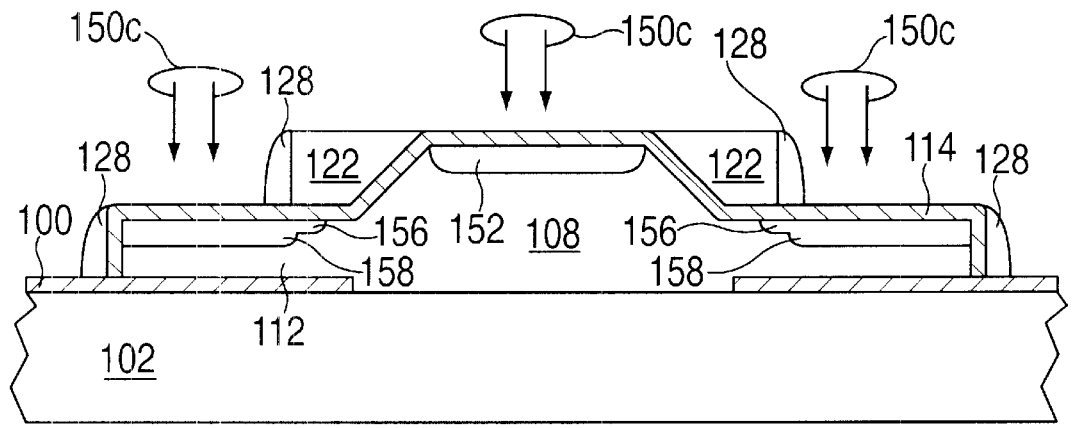

Referring now to FIG. 4(c), photoresist block 154 is removed from the top of mesa region 108 and gate 122, and sidewall spacers 128 are thereafter formed at the edges of gate 122, as described in the earlier embodiment. Then, a second implant, indicated by arrows 150c, is used to form drain region 158 and further increase the doping concentration of the source region 152. Because the source region 152 is exposed to both the first and second dopant implantations, it will have a different (e.g., higher) doping concentration than will the drain regions 158.

Figure 4D:
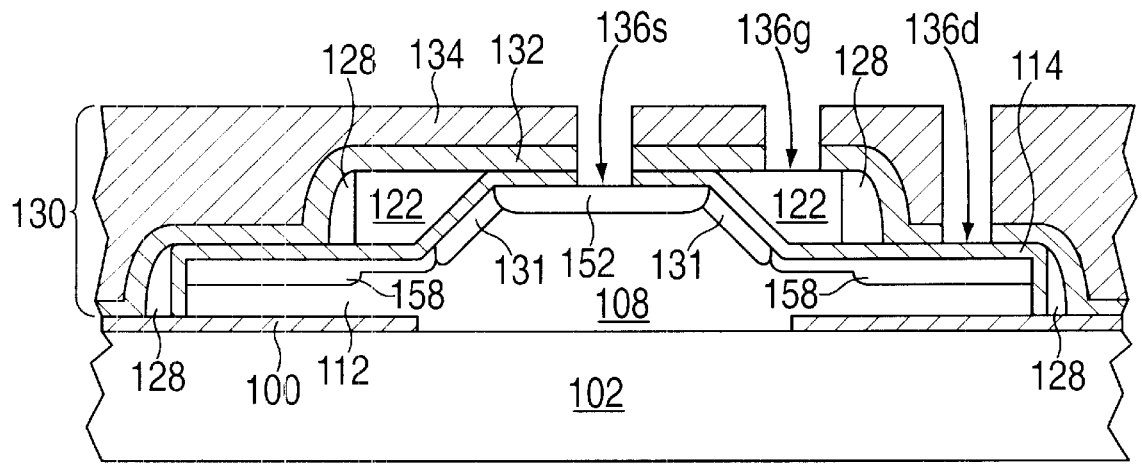

Finally, FIG. 4(d) illustrates the completion of an FET having single junction (drain) isolation characteristics and an asymmetrical doping profile. Once again, a thermal anneal distributes the dopant species in the source and drain regions 152, 158, thereby establishing electrical connections and linking source and drain regions 152, 158 to active device channel regions 131. Once the annealing is completed, dielectric stack 130, comprising nitride layer 132 and BSPG layer 134, is deposited. Then, the contact openings for each area are defined by photolithography, followed by etching of the dielectric stack 130, and thereby forming contact openings or vias for the source, gate and drain terminals (136s, 136g and 136d), respectively.

The single junction embodiment described in FIGS. 4(a)-(d) results in a structure which isolates the drain junction from the underlying bulk, thereby providing the benefits of reduced junction capacitance. Additionally, this embodiment opts to trade off an increase in source junction capacitance for the flexibility in achieving a different dopant profile for the source as compared with that of the drain. This flexibility, achieved through varying the sequence of masking either the source or drain regions from the introduction of dopant species therein, may enhance opportunity for device design. For example, a difference in doping profile between source and drain may be used to alter the zero bias depletion widths associated with source and drain regions. In such a configuration, doping the source more heavily than the drain would produce a narrower depletion region width associated with the source region, thereby improving device reliability by delaying the onset of source/drain punch-through. It will be appreciated that other options for device tailoring also exist.

Still a further advantage of both of the above-described embodiments relates to the effects of overetching and contact misalignment. In the conventional structure of FIG. 1, isolation may also be provided by shallow trench isolation (STI). With STI, the insulating regions are generally adjacent and coplanar with the source and drain regions 12, 14. Unintentional contact misalignment, or borderless contact designs, run the risk of overetching contacts into STI and down along adjacent active device areas of FET region 10, thereby exposing underlying substrate/dopant regions to subsequent contact metallurgy, resulting in excess substrate leakage and poor device reliability. However, with the use of the pad dielectric 100 and block 112, an additional step height is created which provides a measure of protection against such concerns.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A field effect transistor (FET), comprising:

an active semiconductor region defined upon a substrate, said active semiconductor region further having a mesa region formed therein;

a gate formed within said active semiconductor region, said gate abutting said mesa region along a side thereof;

one of a source region or a drain region defined within a first area of said semiconductor region, said first area of said semiconductor region being located over an insulating layer and not including said mesa region; and the other of a source or a drain region defined within a top surface of said mesa region;

wherein said insulating layer isolates said one of a source region or a drain region within said first area of said semiconductor region from said substrate.

2. The FET of claim 1, wherein said drain region is defined in said first area of semiconductor region and said source region is defined within said top surface of said mesa region.

3. The FET of claim 2, wherein said source region has a different dopant concentration than said drain region.

4. The FET of claim 2, wherein said source region has a higher dopant concentration than said drain region.

5. The FET of claim 2, further comprising:

a first dopant implantation, into said source region; and a second dopant implantation, into both said source region and said drain region, said first and second dopant implantations resulting in said source region having a higher dopant concentration than said drain region.

6. The FET of claim 5, further comprising:

a drain extension implant region, said drain extension implant region formed prior to said second dopant implantation.

7. The FET of claim 2, wherein said active semiconductor region further comprises:

said insulating layer formed upon said substrate;

a window opening formed within said insulating layer; and an epitaxial layer grown over said insulating layer and said window opening;

wherein mesa region is formed over said window opening.

8. The FET of claim 7, wherein said insulating layer further comprises a dielectric pad layer deposited upon said substrate.

9. The FET of claim 8, wherein said substrate further comprises single crystalline material beneath said window opening.

10. The FET of claim 9, wherein:

said substrate further comprises single crystalline silicon; and said epitaxial layer comprises single crystalline silicon where said epitaxial layer is grown over said window opening.

11. The FET of claim 10, wherein said epitaxial layer comprises polycrystalline silicon where said epitaxial layer is grown over said dielectric pad layer.

12. The FET of claim 10, wherein said epitaxial layer comprises amorphous silicon where said epitaxial layer is grown over said dielectric pad layer.

13. The FET of claim 7, wherein said gate surrounds said mesa region.

* * * * *